(12) United States Patent
DeWitte et al.

(10) Patent No.: US 11,708,908 B2
(45) Date of Patent: Jul. 25, 2023

(54) SEAL GASKET RETENTION FOR CONNECTOR ASSEMBLY OR HOUSING

(71) Applicant: TE Connectivity Services GmbH, Schaffhausen (CH)

(72) Inventors: Thomas Robert DeWitte, Shelby Township, MI (US); Zoran Krnetic, Mississauga (CA); Lindsey E. Gatesman, Winston Salem, NC (US); David James Rhein, Riley, MI (US); Eric D. Shields, High Point, NC (US)

(73) Assignee: TE Connectivity Solutions GmbH, Schaffhausen (CH)

( * ) Notice: Subject to any disclaimer, the term of this patent is extended or adjusted under 35 U.S.C. 154(b) by 188 days.

(21) Appl. No.: 17/089,625

(22) Filed: Nov. 4, 2020

(65) Prior Publication Data

US 2021/0285545 A1    Sep. 16, 2021

Related U.S. Application Data

(60) Provisional application No. 62/988,094, filed on Mar. 11, 2020.

(51) Int. Cl.
*F16J 15/06*    (2006.01)

(52) U.S. Cl.
CPC .................................. *F16J 15/061* (2013.01)

(58) Field of Classification Search
CPC ............................... F16J 15/061; F16J 15/064
See application file for complete search history.

(56) References Cited

U.S. PATENT DOCUMENTS

| | | | |
|---|---|---|---|
| 4,867,461 A * | 9/1989 | Shimmell | F16J 15/064 277/916 |
| 5,137,674 A * | 8/1992 | Braconier | B29D 99/0053 264/161 |
| 5,511,518 A * | 4/1996 | Jain | F01M 11/0004 123/90.38 |
| 2003/0067122 A1* | 4/2003 | Hinson | F16J 15/127 277/593 |
| 2004/0145121 A1* | 7/2004 | Faurien Des Places | F02F 11/002 277/592 |
| 2005/0127616 A1* | 6/2005 | Dorniok | F16J 15/061 277/628 |
| 2013/0241157 A1* | 9/2013 | Priu Pont | F16J 15/061 277/609 |

(Continued)

FOREIGN PATENT DOCUMENTS

JP    2012122536 A  *  6/2012 ............. F16J 15/024

*Primary Examiner* — Eugene G Byrd (57) ABSTRACT

A gasket assembly includes a substrate, such as a portion of a body of an electrical connector. The substrate defines a mating surface to which a gasket or gasket seal is mechanically fixed. The gasket defines at least one recess or other mounting feature thereon for engaging with a complementary feature of the substrate for fixing the gasket to the substrate. According to an embodiment, the gasket defines a sealing face or sealing wall opposing and/or abutting the mating surface of the substrate, and a sidewall extending from the sealing wall and defined about a perimeter thereof. The sealing wall and sidewall define a circumferential recess configured to receive a peripheral edge of the substrate for securing the gasket to and generally over the mating surface of the substrate.

18 Claims, 5 Drawing Sheets

(56) References Cited

U.S. PATENT DOCUMENTS

2021/0131658 A1\* 5/2021 Verhoeven ............ F21V 31/005
2021/0226285 A1\* 7/2021 Ono ....................... F16J 15/067

\* cited by examiner

SEAL GASKET RETENTION FOR CONNECTOR ASSEMBLY OR HOUSING

CROSS-REFERENCE TO RELATED APPLICATIONS

This application claims priority under 35 U.S.C. § 119 to U.S. Provisional Patent Application No. 62/988,094, filed Mar. 11, 2020.

FIELD OF THE INVENTION

The present disclosure relates to sealing gaskets, and more particularly, to improved systems for securing a sealing gasket to a substrate, such as a portion of an electronic connector or housing of an electronic device.

BACKGROUND

Electronic components, including packaged or housed devices and associated electrical connectors, may be required to perform in harsh environments, including those subjecting the components to dirt and/or moisture. As a result, these assemblies often include one or more primary sealing elements arranged between adjacent parts thereof for preventing sensitive components from exposure to the elements. Further, despite adequate sealing between critical components, spaces or gaps resulting between, for example, a mounted component and a mounting surface, may create areas wherein dirt and/or moisture may become trapped. In time, this can lead to undesired corrosion of portions of an assembly. Accordingly, in addition to primary sealing elements used to seal critical components, assemblies often require the addition of secondary seals or gaskets for preventing corrosion in undesired areas, by way of example only. In order to ensure a reliable seal in these secondary areas, a gasket or seal must be placed accurately and retained in a desired position during a manufacturing process and subsequent use.

Existing solutions for accurately forming and retaining a gasket or perimeter seal on a surface of a device or a substrate typically include over-molding gasket material onto another part, or dispensing a material (e.g., a liquefied elastomeric gasket material) onto a part to create a seal bead that is bonded to the part. Each of these methods add additional or secondary steps to a manufacturing process, increasing the cost and complexity of the final product. Moreover, these operations typically require additional capital equipment for performing the over-molding or dispensing tasks.

Accordingly, there is a need for more cost effective systems and methods for implementing gaskets or seals into the production of various assemblies.

SUMMARY

A component assembly, such as an electrical connector, is provided which includes a substrate portion on which the creation of a seal is required. According to an embodiment of the present disclosure, the substrate may comprise, for example, a mounting flange of the connector, and generally defines a mating surface to which a gasket or gasket seal is to be mechanically fixed. The gasket defines at least one recess or other mounting feature thereon for engaging with a complementary feature of the substrate for fixing the gasket to the substrate. For example, according to an embodiment, the gasket defines a sealing face or sealing wall opposing and/or abutting the mating surface of the substrate, and a sidewall extending from the sealing wall about a perimeter thereof. The sealing wall and sidewall of the gasket define a circumferential recess configured to receive a peripheral edge of the substrate for securing the gasket to and generally around at least one side of the substrate.

According to another embodiment of the present disclosure, a gasket and a substrate each define one of a protrusion or a corresponding recess (e.g., a through hole) configured to receive the protrusion for fixing the gasket to the substrate. The protrusion or corresponding recess may be formed on a sidewall of the gasket, and the other one of the protrusion or corresponding recess may be formed on a sidewall of the substrate. In another embodiment, the protrusion and recess define a "dove-tail" arrangement, in which the recess includes at least one sidewall defining an undercut into which a complimentary portion of the protrusion is inserted and retained. The protrusion and corresponding recess may be arranged on opposing sides of the substrate and the gasket, for example, on opposing sides of the sealing wall of the gasket and the mating surface of the substrate, respectively.

In still a further embodiment, a substrate defines an aperture formed therein and a gasket defines a through hole corresponding in location to the aperture. A fastener is arranged through the through hole of the gasket and is received within the aperture of the substrate for securing the gasket to the substrate. An annular recess surrounding the aperture may be formed in the mating surface of the substrate. The gasket may include an annular step configured to engaged with or inserted into the recess, wherein the annular step is retained within the recess by a radial head of the inserted fastener. One or more protrusions may extend from within the recess, or from the mating surface of the substrate, in a direction opposite an insertion direction of the fastener. The protrusion is sized and located so as to abut the fastener in an installed state thereof, limiting its insertion into the aperture and thus the amount of compressive force applied to the gasket.

BRIEF DESCRIPTION OF THE DRAWINGS

The invention will now be described by way of example with reference to the accompanying figures, of which.

DETAILED DESCRIPTION OF THE EMBODIMENTS

Exemplary embodiments of the invention will be described hereinafter in detail with reference to the attached drawings, wherein like reference numerals refer to like elements. The invention may, however, be embodied in many different forms and should not be construed as being limited to the embodiments set forth herein; rather, these embodiments are provided so that the present disclosure will be thorough and complete, and will fully convey the concept of the disclosure to those skilled in the art.

Gasket seals (also referred to interchangeably herein as gaskets, sealing gaskets, or seals) and associated retention systems according to embodiments of the present disclosure eliminate many of the above-described drawbacks of the prior art. As set forth in detail herein, embodiments include various systems for providing mechanical retention of a sealing gasket on at least a surface of a substrate, such an electrical header or connector. In each of the embodiments, the sealing gasket defines one or more features, and more specifically, an opening or recess thereon for receiving a portion of the substrate for the purpose of mechanically fixing the gasket to the substrate. These systems and/or features include, but are not limited to; a pre-formed gasket configured to stretch over the substrate; a protrusion and associated aperture or recess that engage each other to retain a gasket in place; a dovetail style joint formed by the gasket and the substrate; a protrusion and slot pattern that lock over each other; and/or gasket and substrate features that utilize a fastener and a compression limiter to retain a gasket or other sealing element. These approaches reduce cost and required capital investment and also improve production efficiency, as curing time is no longer required. Embodiments described herein provide the further benefit of being easily replaceable in the event of wear or damage, as distinct from the molded arrangements of the prior art.

Figure 1:
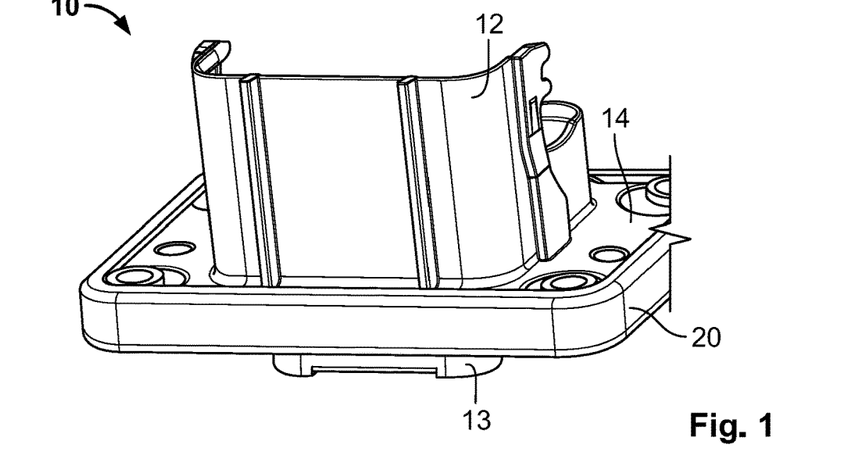
FIG. 1 is perspective view of an assembly including a gasket or gasket seal attached to a substrate or connector housing according to an embodiment of the present disclosure.
Figure 2:
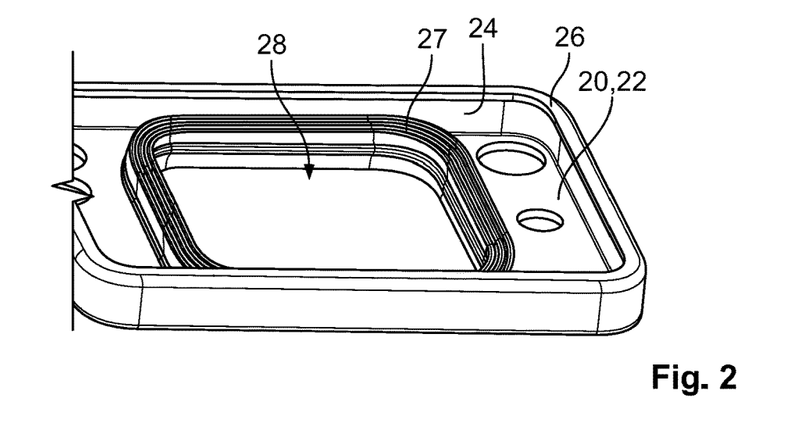
FIG. 2 is perspective view of the prefabricated gasket shown in the assembly of FIG. 1.
Figure 3:
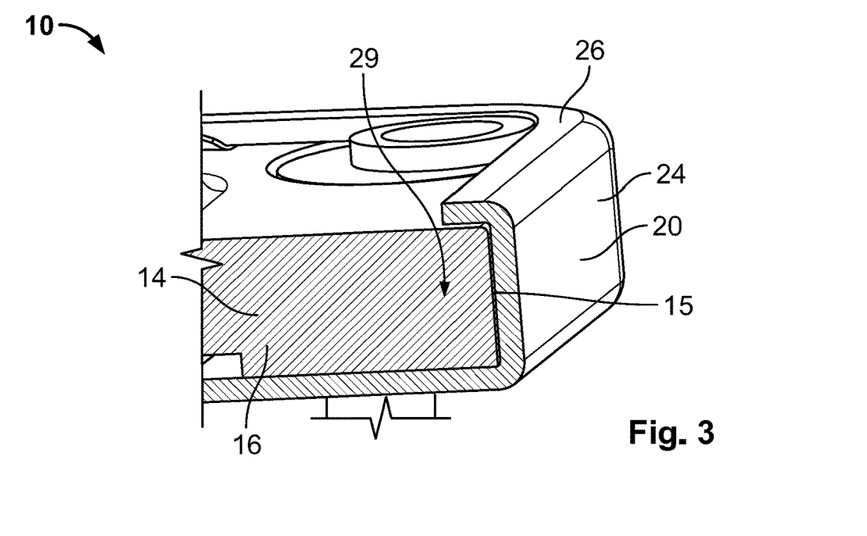
FIG. 3 is partial cross-sectional view of the assembly of FIG. 1.

Referring generally to FIGS. 1-3, an exemplary substrate or gasket assembly 10 according to an embodiment of the present disclosure may comprise an electrical connector or header including a first end 12 (e.g. a male or female connector end) protruding from a first side of a substrate, connector body or flange 14, and a second end 13 protruding from an underside or mating surface 16 of the substrate 14. A sealing gasket 20 is provided and fixedly mounted to the substrate 14 via a retention system according to the present disclosure. The gasket 20 may comprise a flexible or elastic polymer material, and is prefabricated, such as via an injection molding process, prior to its installation onto the substrate 14. The gasket 20 defines a sealing wall 22 including an outer facing side, and an inner facing side opposing the mating surface 16 of the substrate 14 in an installed position shown in FIGS. 1 and 3. The gasket 20 further includes a sidewall 24 defined about an outer perimeter of the sealing wall 22 and extending generally perpendicularly from the inner facing side thereof. A circumferential retaining lip defined by a free end 26 of the sidewall 24 extends at an angle from a generally vertical portion of the sidewall, for example, generally perpendicularly therefrom as shown in detail in FIG. 3. The free end 26, the sidewall 24 and the sealing wall 22 define a circumferential recess 29 sized to receive the peripheral edge of the substrate 14 therein in the installed position. The gasket 20 may further comprise additional mating features, such as apertures for receiving complementary features of the connector or substrate 14 once fitted thereto. For example, the exemplary gasket 20 includes an aperture 28 formed therethrough for accepting the second end 13 of the connector when installed onto the substrate 14 (see FIG. 1). A raised sealing ring or rib 27 is also provided about the perimeter of the aperture 28 for providing a primary seal with a corresponding object (e.g., a device housing) on the underside or mating surface 16 of the substrate 14.

Referring more specifically to FIG. 3, installing the gasket 20 over the substrate 14 may include the step of elastically deforming the gasket so as to expand an opening thereof defined by the sidewall 24. Once expanded, the substrate 14 may be inserted into the opening such that the substrate is secured between the sealing wall 22 and the free end 26 of the sidewall 24, with a sidewall 15 of the substrate generally abutting the sidewall of the gasket. Elastic tension applied by the gasket 20 on the substrate 14, as well as the resulting friction generated therebetween, retains the gasket 20 in position on the substrate 14 without the need for additional fasteners or materials, such as adhesive. Moreover, the gasket 20 may be easily removed for repair or replacement as needed, unlike embodiments of the prior art.

Figure 4:
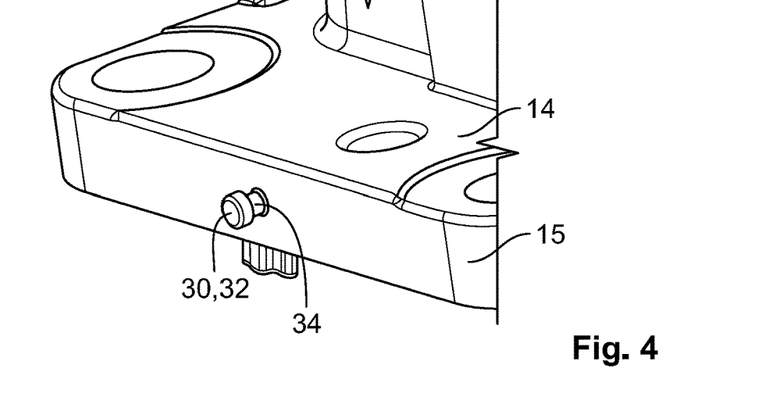
FIG. 4 is partial perspective view of a substrate or connector housing according to an embodiment of the present disclosure.
Figure 5:
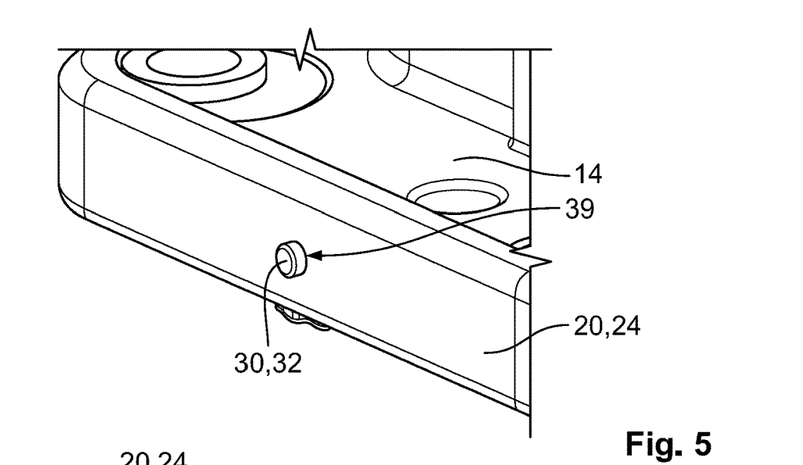
FIG. 5 is partial perspective view of an assembly including the substrate or connector housing of FIG. 4 fitted with a gasket according to an embodiment of the present disclosure.
Figure 6:
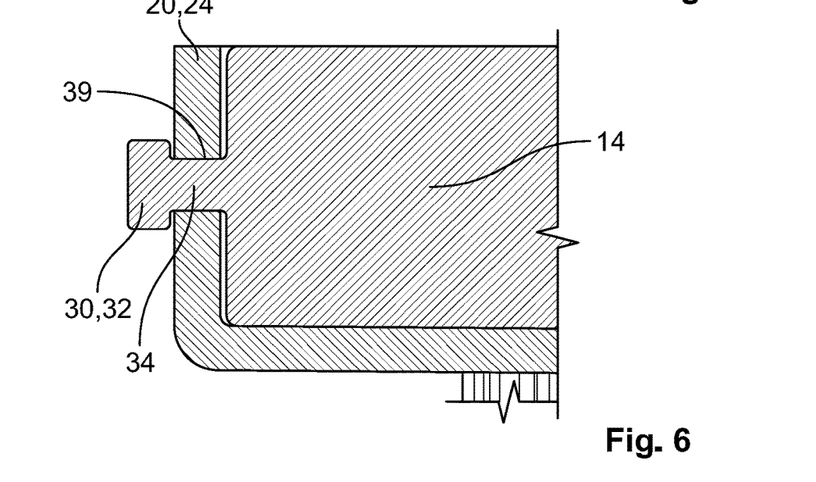
FIG. 6 is partial cross-sectional view of the assembly of FIG. 5.

Referring generally to FIGS. 4-6, an embodiment of the present disclosure includes additional retention features which may be used in conjunction with the features set forth above with respect to FIGS. 1-3. For example, in the illustrated embodiment, the gasket 20 and substrate 14 comprise complementary locking features for mechanically securing the gasket to the substrate. More specifically, the gasket 20 may define one or more apertures 39 (e.g., a hole or a slot) formed through the sidewall 24. In one embodiment, this includes at least one aperture for each sidewall section (e.g., each side of the gasket), or a plurality of apertures spaced about a perimeter of the gasket. Each aperture 39 is configured (e.g., sized and positioned) to receive a corresponding protrusion 30 extending from a respective sidewall 15 of the substrate 14. Each protrusion 30 may be formed integrally with the substrate 14, or may be fitted or secured thereto (e.g., screwed, pressed or adhered). In the exemplary embodiment, the protrusion 30 defines a head 32 formed on end thereof which is larger in a lateral or radial dimension compared to a stem 34, thereby forming an undercut about a circumference of the stem. The aperture 39 of the gasket 20 may be sized correspondingly to the stem 34, wherein the protrusion 30 is fitted through the aperture via the temporarily elastic deformation (i.e., stretching) of the aperture to accommodate the expanded head 32. Once inserted past the head 32, the aperture 39 may elastically contract into the undercut, creating a secure, positively engaged connection between the gasket 20 and the substrate 14 that cannot be easily moved or removed from the illustrated position. While a circular aperture and protrusion are shown, it should be understood that embodiments of the present disclosure may include other shapes and configurations, for example, configurations including a protrusion defining at least one undercut for receiving a complementary portion of a gasket. Likewise, it should be understood that the relative location of the protrusion and aperture may be reversed (i.e., the protrusion formed on the gasket), without departing from the scope of the present disclosure.

Figure 7:
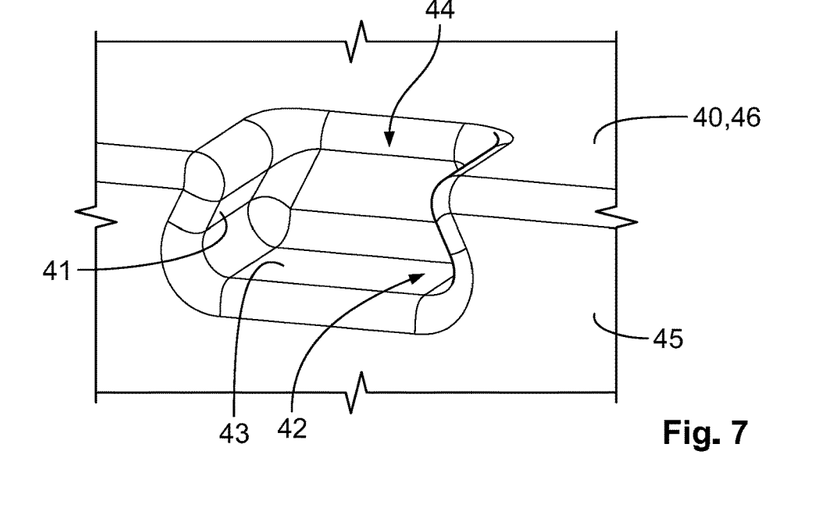
FIG. 7 is partial perspective view of a substrate or connector housing according to an embodiment of the present disclosure.
Figure 8:
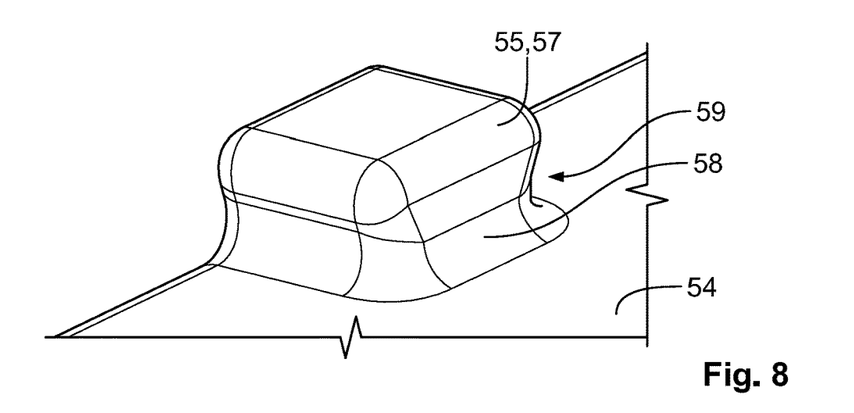
FIG. 8 is partial perspective view of a gasket according to an embodiment of the present disclosure.
Figure 9:
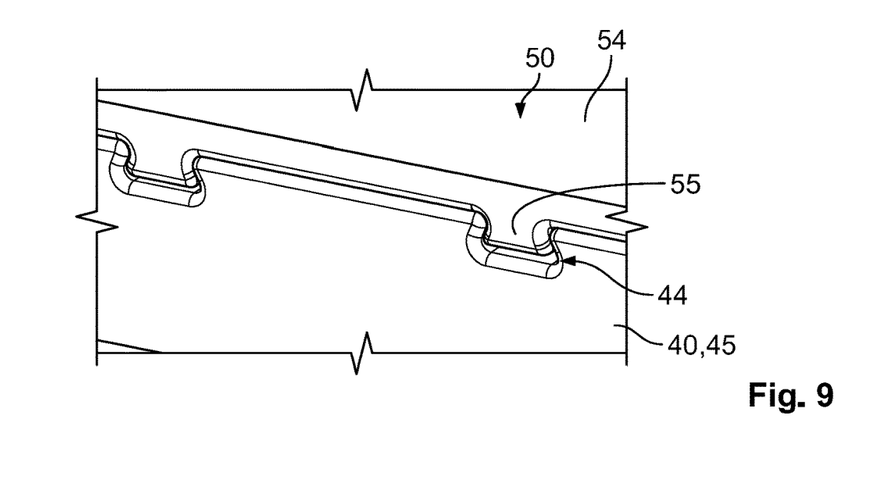
FIG. 9 is partial perspective view of an assembly including the substrate or connector housing of FIG. 7 fitted with the gasket of FIG. 8.

Referring now to FIGS. 7-9, another embodiment of a substrate and/or gasket assembly 50 utilizing complementary mating or retaining features is provided. In the illustrated embodiment, a substrate 40 and gasket 54 each define complementary portions of a "dovetail" style joint. With reference generally to FIGS. 7 and 9, the substrate 40 may include a plurality of recesses 44 formed therein and defined by at least three sidewalls 41, with two of the sidewalls generally opposing one another and a third arranged generally normal thereto. Each of the sidewalls 41 extends from a base or bottom wall 43 of the recess 44 and defines an undercut 42 and an associated overhanging portion arranged thereabove. In one embodiment, the undercut 42 is realized by the sidewall 41 extending from the bottom wall 43 at an angle, or curving, in a direction toward a center of the recess 44, such that a top of the recess 44 opening onto a mating surface 46 of the substrate 40 is smaller in area or in a width dimension compared to a lower portion of the recess 44 proximate the bottom wall 43. The recess 44 further defines an open side or opening arranged opposite the normally-arranged sidewall 41 that opens onto, or in a direction of, a sidewall 45 of the substrate 40. In other embodiments, the recess 44 may be a four-sided recess, with each side comprising a sidewall defining an undercut.

Similarly, and referring to FIGS. 8 and 9, the gasket 54 may define a plurality of protrusions 55 complementary in profile to the recesses 44 of the substrate 40. In the exemplary embodiment, each protrusion 55 comprises four sidewalls, with at least three sidewalls 58 comprising angled or curved profiles matching that of the sidewalls 41 of the recess 44. Specifically, the sidewalls 58 extend generally vertically and may expand as they extend so as to define an enlarged head portion 57 which is wider or otherwise larger than a middle or base portion thereof. In this way, a recessed undercut 59 extending at least partially around the protrusion 55 is defined therein. The remaining sidewall (shown in FIG. 9) of the protrusion 55 may be generally planar in nature and thus co-planar with the sidewall 45 of the substrate 40 in an installed position.

Still referring to FIG. 9, each protrusion 55 of the gasket 54 is sized so as to positively engage with the recess 44 formed in the substrate 40. In one embodiment, fixing the gasket 54 to the substrate 40 includes stretching or otherwise deforming the gasket 54 laterally, such that the gasket and protrusion 55 thereof extend beyond the sidewall 45 of the substrate. In this way, the protrusion 55 may be introduced into the recess 44 via the opening thereof defined in the sidewall 45. The protrusion 55 is captured or retained within the recess 44 under the elastic tension of the gasket 54 in conjunction with the commentary tapered sidewalls of the dove-tail arrangement.

Figure 10:
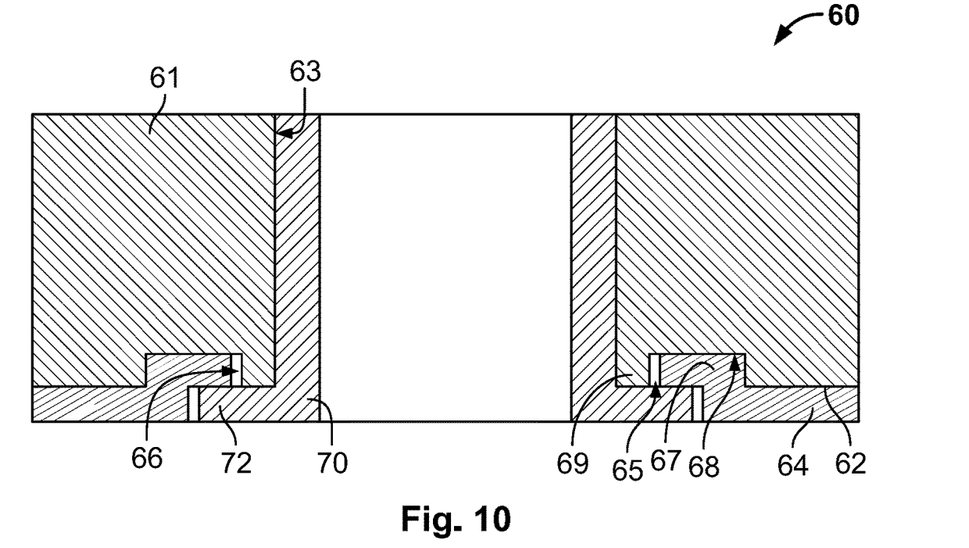
FIG. 10 is cross-sectional view of an assembly including a substrate or connector housing fitted with a gasket according to another embodiment of the present disclosure.

FIG. 10 is a cross-sectional view of an assembly 60 according to another embodiment of the present disclosure. The assembly 60 includes a sealing gasket 64 attached to a substrate 61 via an insert or a fastener 70. The substrate 61 comprises an aperture 63 (e.g., a circular through hole or linear slot) extending at least partially therethrough. A recess 68, such as an annular recess in the case of a circular through hole, may be formed in a mating surface 62 of the substrate 61 and encircles the aperture 63. The recess 68 and the aperture 63 may be separated in a lateral or radial direction by a protrusion or lip 69 (e.g., an annular lip) defined by the substrate 61, with a top of the lip arranged generally coplanar with the mating surface 62 of the substrate.

Still referring to FIG. 10, the sealing gasket 64 is configured to be arranged over and fastened to the mating surface 62 of the substrate 61. As illustrated, the gasket 64 defines one or more apertures 65 formed therethrough. An end of the gasket 64 surrounding each aperture 65 may be defined by a step 67 (e.g., an annular step), including a first portion extending normally from a planar surface of the sealing gasket, and a second portion extending inward from the first portion in a direction of an axial center of the aperture 65. The step 67 is sized so as to be received within the recess 68 of the substrate 61. In one embodiment, the thickness of the step 67 is at least equal to, or slightly greater than, a depth of the recess 68.

In order to secure the sealing gasket 64 to the substrate 61, an insert or fastener 70 is introduced through the aperture 65 and into the aperture 63. The fastener 70 is held therein via a press-fit or a threaded connection with the aperture 63 of the substrate 61, by way of example only. A lip or head 72 of the fastener 70 is configured to compress the step 67 of the gasket 64 into the recess 68 for creating a sealed joint. As shown, the recess 68 may be oversized compared to the step 67, creating a free space 66 into which the step 67 may elastically expand or deform under a compressive force via the fastener 70. The protrusion 69 of the substrate 61 may act as a compression limiter, limiting the insertion depth of the fastener 70 and thus the deformation of and/or the pressure applied to the gasket 64. While one fastening arrangement is shown, it should be understood that a given connector or substrate may comprise a plurality of these fastening arrangements over a surface thereof (e.g., in each of four corners of a rectangular substrate) for more uniformly retaining a gasket thereto, as shown with reference to the substrate 14 of FIG. 1.

Figure 11:
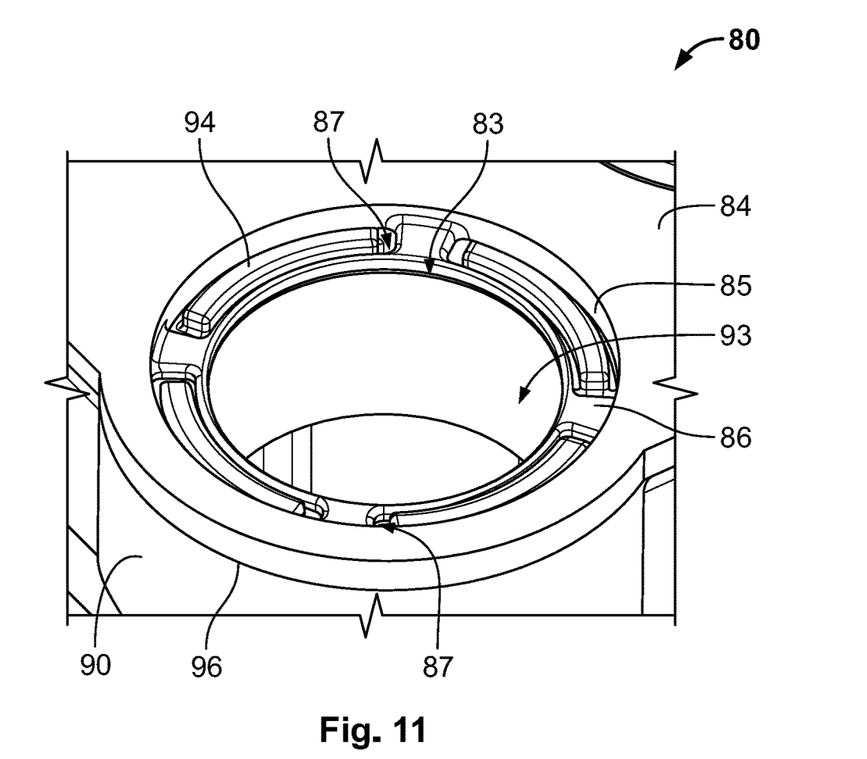
FIG. 11 is a partial perspective view of an assembly including a substrate or connector housing fitted with a gasket according to another embodiment of the present disclosure.

Referring now to FIGS. 11-14, another embodiment of an assembly 80 utilizing an insert or fastener for securing a gasket to a substrate is provided. FIG. 11 illustrates the assembly 80 without an insert or fastener present, wherein a generally planar gasket 84 comprises one or more annular recesses 85 or counterbores formed therein (e.g., one of each corner of a substantially rectangular gasket). The recess 85 includes an annular base or annular step 86 projecting radially inward from a remainder of the gasket and defines an aperture or through hole 83 formed therethrough. The through hole 83 is coaxially aligned with a corresponding aperture 93 of a substrate 90 to which the gasket 84 is to be attached. Arcuate slots 87 are defined through the annular base 86, with each slot following an arc defined about a common axis of curvature (e.g., a central axis of the through hole 83). Segments of the annular base 86 extend between adjacent slots 87 and define a continuous inner annular ring for defining the through hole 83. With the gasket 84 installed onto a mating surface 96 of the substrate 90, the slots 87 are configured to receive corresponding arcuate protrusions 94 extending from a mating surface 96 of the substrate 90.

Figure 12:
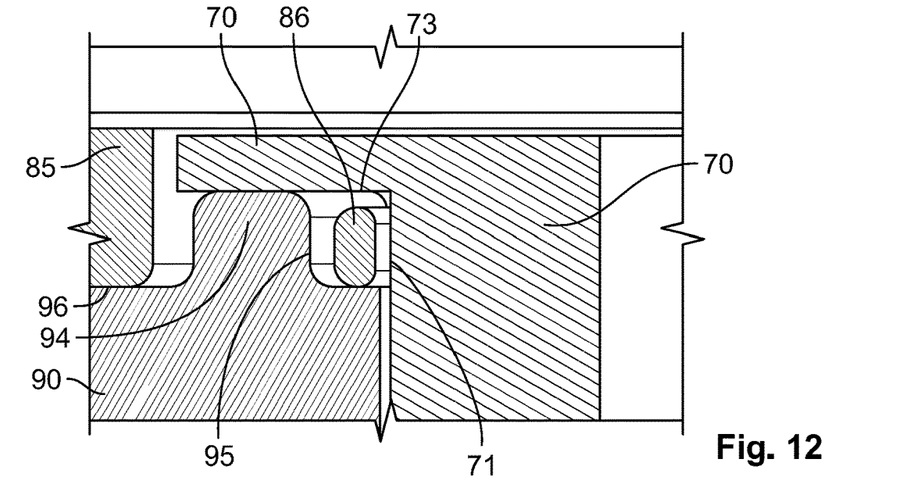
FIG. 12 is first cross-sectional view of the assembly of FIG. 11.
Figure 13:
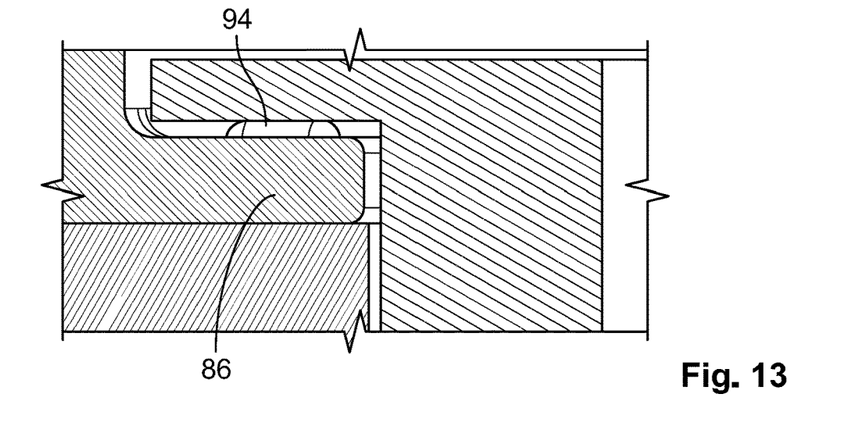
FIG. 13 is second cross-sectional view of the assembly of FIG. 11.
Figure 14:
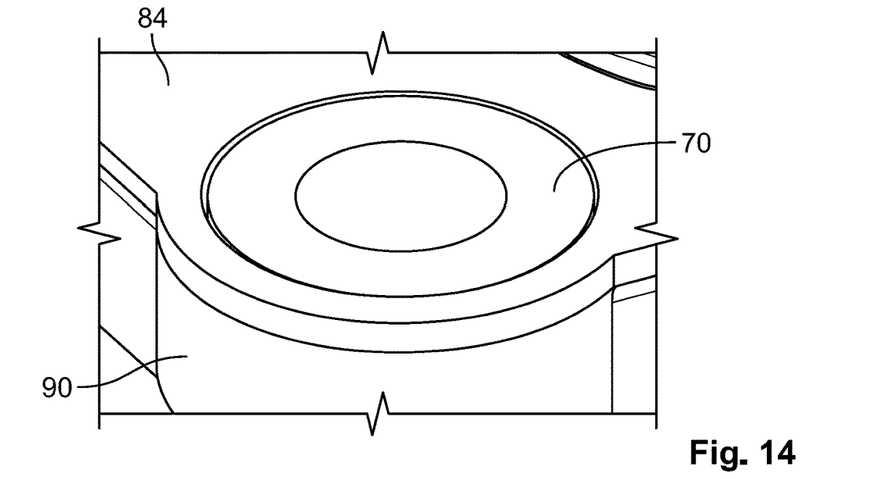
FIG. 14 is a partial perspective view of the assembly of FIG. 11 with a fastener installed therein.

In an assembled state shown in FIGS. 12-14, the assembly 80 includes an insert or fastener 70 inserted through the coaxial apertures 83,93 of the gasket 84 and the substrate 90 for retaining the gasket relative to the substrate. With particular reference to the cross-sectional views of FIGS. 12 and 13, with the fastener 70 in an installed position, portions of the annular base 86 of the gasket 84 are captured within a space created between a surface 95 of the protrusions 94, an opposing surface 71 of the fastener 70, the mating surface 96 and an underside surface 73 of the head of the fastener 70. As illustrated in FIG. 14, in the assembled state, the exposed side of the head of the fastener 70 may be recessed below a generally parallel planar upper or exposed surface of the gasket 84, ensuring the fastener does not interfere with the subsequent mating of any additional components to this surface of the gasket 84.

Referring again to FIGS. 12 and 13, in the illustrated exemplary embodiment, the gasket 84 is retained without a compressive force acting thereon by the fastener 70. More specifically, at least one of the arcuate protrusions 94 of the substrate 90 has a height in the vertical direction that is greater than a height in the vertical direction of the annular base 86 of the gasket 84, such that the insertion depth of the fastener 70 is limited by the protrusion. In this way, the protrusion 94 functions as a mechanical stop for the fastener 70 in the insertion direction, limiting or eliminating compression on the gasket 84 in an installed state of the fastener. As a result, damage to or deformation of the gasket 84 by undesired pressure exerted thereon by the fastener 70 may be prevented. Similarly, in other embodiments the height of the protrusions 94 in the vertical direction may be reduced from that shown in the figures, such that the fastener 70 is permitted to engage with and compress the gasket 84 a desired amount, potentially improving sealing characteristics and/or increasing gasket retention forces. The height of the protrusion 94 can be selectively varied by application in order to control the desired compressive force permitted to act on the gasket 84 via the fastener 70.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range.

Also, the indefinite articles "a" and "an" preceding an element or component of the invention are intended to be nonrestrictive regarding the number of instances, that is, occurrences of the element or component. Therefore "a" or "an" should be read to include one or at least one, and the singular word form of the element or component also includes the plural unless the number is obviously meant to be singular.

The term "invention" or "present invention" as used herein is a non-limiting term and is not intended to refer to any single embodiment of the particular invention but encompasses all possible embodiments as described in the application.

What is claimed is:

1. A gasket assembly of an electronic device, comprising:
a substrate defining a mating surface configured to be sealed relative to another surface; and
a sealing gasket removably attached to the substrate and defining at least one recess engaging with the substrate for mechanically fixing the gasket substantially over the mating surface of the substrate, the gasket includes a sealing wall abutting the mating surface of the substrate and a sidewall extending from a perimeter of the sealing wall and defining a circumferential recess configured to receive a peripheral edge of the substrate for attaching the gasket to the substrate, a recess is formed in the mating surface of the substrate and the gasket defines a protrusion on a side of the sealing wall abutting the mating surface of the substrate, the protrusion is received within the recess of the substrate for fixing the gasket to the substrate, the recess of the substrate defines an undercut and a portion of the protrusion of the gasket is received within the undercut.

2. The gasket assembly of claim 1, wherein the sidewall defines a free end oriented generally parallel with the sealing wall, the circumferential recess defined between the free end of the sidewall and the sealing wall.

3. The gasket assembly of claim 1, wherein the protrusion of the gasket defines an expanded end having a width greater than another portion of the protrusion, wherein the recess of the gasket is defined between the expanded end of the protrusion and the sealing wall of the gasket.

4. The gasket assembly of claim 3, wherein the expanded end of the protrusion is received within the undercut of the recess of the substrate.

5. The gasket assembly of claim 4, wherein the undercut extends around a plurality of sides of the recess of the substrate.

6. The gasket assembly of claim 1, wherein the recess of the substrate opens in a first direction towards the mating surface of the substrate and opens in a second direction towards a sidewall of the substrate.

7. The gasket assembly of claim 1, wherein the substrate defines an aperture formed therein and the gasket defines a through hole, wherein a fastener is arranged through the through hole of the gasket and into the aperture of the substrate for securing the gasket to the substrate.

8. The gasket assembly of claim 7, wherein an annular recess formed in the mating surface of the substrate surrounds the aperture, and wherein the gasket includes an annular step defining the through hole and received within the annular recess of the substrate.

9. The gasket assembly of claim 8, wherein the substrate defines an annular protrusion extending from the mating surface and generally between the annular recess and the aperture, and wherein a head of the fastener inserted into the aperture abuts the annular protrusion, and retains the annular step of the gasket seal the annular recess.

10. The gasket assembly of claim 7, wherein the substrate includes a plurality of arcuate protrusions extending from the mating surface and arranged radially about the aperture.

11. The gasket assembly of claim 10, wherein the gasket comprises an annular recess surrounding the through hole, wherein a bottom surface of the annular recess defines a plurality of arcuate slots for receiving the arcuate protrusions of the substrate.

12. The gasket assembly of claim 11, wherein a head of the fastener inserted into the aperture abuts the arcuate protrusions for limiting the insertion depth of the fastener within the aperture.

13. A gasket assembly, comprising:
a substrate, including:
a mating surface configured to be sealed relative to another surface;
an aperture formed in the mating surface; and
a protrusion extending from the mating surface, the protrusion comprises an arcuate protrusion arranged radially about the aperture;
a sealing gasket removably attached to the substrate and arranged substantially over the mating surface, including:
a through hole coaxially aligned with the aperture of the substrate, the aperture of the substrate comprises an arcuate slot formed at least partially surrounding the through hole;
a recess surrounding the through hole; and an aperture formed through a bottom surface of the recess and receiving the protrusion of the substrate; and a fastener arranged through the through hole of the gasket and into the aperture of the substrate for securing the gasket to the substrate.

14. A gasket assembly of an electronic device, comprising:
   a substrate defining a mating surface configured to be sealed relative to another surface; and
   a sealing gasket removably attached to the substrate and defining at least one recess engaging with the substrate for mechanically fixing the gasket substantially over the mating surface of the substrate, the substrate defines an aperture formed therein and the gasket defines a through hole, a fastener is arranged through the through hole of the gasket and into the aperture of the substrate for securing the gasket to the substrate, an annular recess formed in the mating surface of the substrate surrounds the aperture, the gasket includes an annular step defining the through hole and received within the annular recess of the substrate.

15. The gasket assembly of claim 14, wherein the substrate defines an annular protrusion extending from the mating surface and generally between the annular recess and the aperture, and wherein a head of the fastener inserted into the aperture abuts the annular protrusion, and retains the annular step of the gasket seal the annular recess.

16. A gasket assembly of an electronic device, comprising:
   a substrate defining a mating surface configured to be sealed relative to another surface; and
   a sealing gasket removably attached to the substrate and defining at least one recess engaging with the substrate for mechanically fixing the gasket substantially over the mating surface of the substrate, the substrate defines an aperture formed therein and the gasket defines a through hole, a fastener is arranged through the through hole of the gasket and into the aperture of the substrate for securing the gasket to the substrate, the substrate includes a plurality of arcuate protrusions extending from the mating surface and arranged radially about the aperture, the gasket comprises an annular recess surrounding the through hole, a bottom surface of the annular recess defines a plurality of arcuate slots for receiving the arcuate protrusions of the substrate.

17. The gasket assembly of claim 16, wherein a head of the fastener inserted into the aperture abuts the arcuate protrusions for limiting the insertion depth of the fastener within the aperture.

18. A gasket assembly of an electronic device, comprising:
   a substrate defining a mating surface configured to be sealed relative to another surface; and
   a sealing gasket removably attached to the substrate and defining at least one recess engaging with the substrate for mechanically fixing the gasket substantially over the mating surface of the substrate, the gasket includes a sealing wall abutting the mating surface of the substrate and a sidewall extending from a perimeter of the sealing wall and defining a circumferential recess configured to receive a peripheral edge of the substrate for attaching the gasket to the substrate, a recess is formed in the mating surface of the substrate and the gasket defines a protrusion on a side of the sealing wall abutting the mating surface of the substrate, the protrusion is received within the recess of the substrate for fixing the gasket to the substrate, the recess of the substrate opens in a first direction towards the mating surface of the substrate and opens in a second direction towards a sidewall of the substrate.

\* \* \* \* \*